United States Patent [19]

Gebrian et al.

[11] Patent Number: 4,495,014
[45] Date of Patent: Jan. 22, 1985

[54] LAMINATING AND TRIMMING PROCESS

[75] Inventors: Peter L. Gebrian; Charles B. Jones, both of Wilmington, Del.

[73] Assignee: E. I. Du Pont de Nemours and Company, Wilmington, Del.

[21] Appl. No.: 467,649

[22] Filed: Feb. 18, 1983

[51] Int. Cl.³ .................. B32B 31/20; B32B 31/12; B29C 27/00

[52] U.S. Cl. .................. 156/80; 156/234; 156/235; 156/236; 156/237; 156/238

[58] Field of Search .............. 156/234–238, 156/247–249, 281, 282, 299, 302, 344, 80, 310, 322

[56] References Cited

U.S. PATENT DOCUMENTS

| 3,469,982 | 9/1969 | Celeste | 430/256 |
| 3,629,036 | 12/1971 | Isaacson | 156/241 X |
| 3,645,772 | 2/1972 | Jones | 156/659.1 X |
| 3,654,016 | 4/1972 | Alexander | 156/247 |
| 4,075,051 | 2/1978 | Brzozowski | 156/236 |
| 4,255,217 | 3/1981 | Franze | 156/209 |
| 4,338,152 | 7/1982 | Del Bianco et al. | 156/361 X |
| 4,378,264 | 3/1983 | Pilette et al. | 156/238 |

FOREIGN PATENT DOCUMENTS 0041643 12/1981 European Pat. Off. .

Primary Examiner—William A. Powell
Assistant Examiner—Thomas Bokan

[57] ABSTRACT

Lamination and trimming of discrete sections of a supported photosensitive layer employs reversal of the direction of travel of a photosensitive layer while such layer is not laminated to the same or a different substrate.

32 Claims, 3 Drawing Figures

4,495,014

LAMINATING AND TRIMMING PROCESS

BACKGROUND OF THE INVENTION

This invention relates to a process for laminating a discrete section of a photosensitive layer to at least one substrate and automatically trimming the laminated sections.

Isaacson, in U.S. Pat. No. 3,629,036 discloses a process for laminating sections of a photosensitive layer to a series of substrates wherein a liquid adhering compound is employed.

Brzozowski in U.S. Pat. No. 4,075,051 discloses laminating a photosensitive film to a series of substrates whereby trimming is achieved by use of a solvent or softening agent which is applied to specific areas of the film to weaken it.

Pilette and Johnson in allowed U.S. application Ser. No. 244,792 filed Mar. 27, 1981 now U.S. Pat. No. 4,378,264 (equivalent to European patent application No. 81104013.8) disclose laminating and trimming of a continuous layer of a photosensitive composition whereby the trimming is accomplished pulling on a laminated substrate along its longitudinal axis in the direction of advancement wherein the breaking strength of the laminated layer is exceeded.

European patent application No. 81104014.6 discloses laminating and trimming of a photosensitive film whereby the film contains solvent particles and has certain physical characteristics which aids the film to trim, i.e., break, upon application of external force.

SUMMARY OF THE INVENTION

The present invention is directed to a process for laminating discrete sections of a supported photosensitive layer to at least one sheet substrate comprising (a) laminating under pressure a section of the supported photosensitive layer to a moving sheet substrate, (b) releasing the laminating pressure from the photosensitive layer and the sheet substrate, (c) removing the support from the laminated layer and concurrently or thereafter trimming the photosensitive layer substantially at a line dividing where laminating pressure and no laminating pressure has been applied to said photosensitive layer wherein a time interval of not less than 0.5 seconds is present between the release of pressure in step (b) and the support removal of step (c), (d) reversing the direction of travel of the photosensitive layer which is not laminated to the sheet substrate, (e) repeating steps (a), (b) and (c) to laminate another section of photosensitive layer to the same or a different substrate.

DETAILED DESCRIPTION OF THE INVENTION

Figure 1:
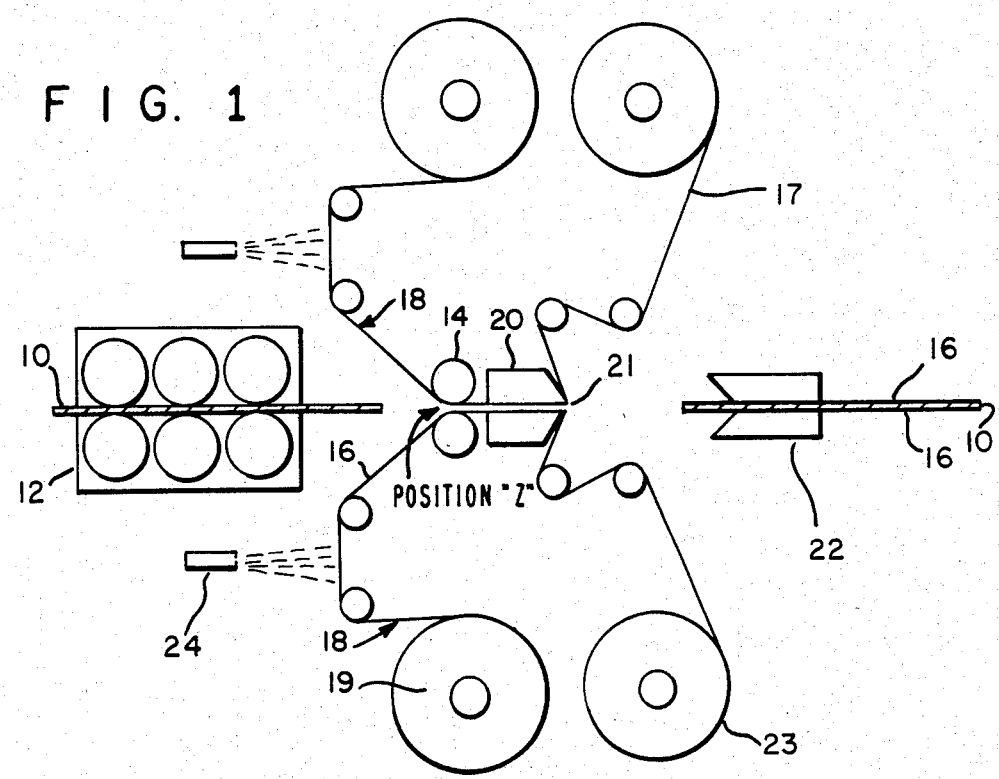
FIG. 1 is a schematic representation of the process of the present invention involving laminating and trimming of a photosensitive layer applied to a substrate.

The description of the present invention is described herein with reference to the figures particularly to a preferred application of the process in laminating and trimming a photosensitive film on both sides of a sheet substrate, which is conventionally used in making a printed circuit board. The laminating and trimming process of this invention may be carried out in a horizontal plane (i.e., FIG. 1 depicts a "front" view) or in a vertical plane (i.e., FIG. 1 depicts a top view). Although the laminating and trimming process of this invention is particularly useful in applying photoresist film to both sides of a printed circuit substrate, the process is also useful in applying and trimming a photosensitive layer for a single surface of a substrate.

Since the process steps are the same on both sides of the substrate the following description is directed to applying the film to one side, realizing that the simultaneous application to the second side is the same.

Referring to FIG. 1, a metal clad substrate (10), such as one with a copper surface, hereinafter also identified as a "board", is precleaned by scrubbing, rinsing and drying, such as described for instance in European patent application No. 81103966.8 and is advanced, optionally through a preheating station (12), to the open nip formed by two separated parallel pressure rolls (14).

A web of photosensitive film (18) which includes a photosensitive layer (16) coated on a carrier web (17) is advanced from a feed roll (19) to the open nip and over each pressure roll (14) so that the photosensitive layer faces inward toward the advancing board (10). Each web exiting the open nip passes between two wedge shaped plates (20) and is drawn back over each respective angled edge (21) of the wedges and accumulated on a takeup roll (23).

Figure 2:
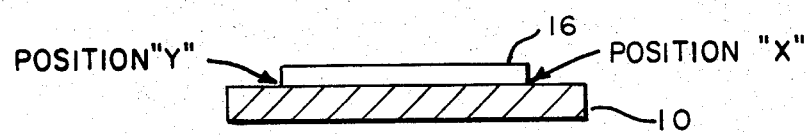
FIG. 2 is a cross section of a substrate with an applied photosensitive layer.

As the board (10) and photosensitive film (18) pass into the open nip, the pressure rolls (14) are brought together at a specified distance at or behind the leading edge of the board, hereinafter identified as position "X", to form a line of pressure perpendicular or substantially perpendicular to the direction of advance. This position "X" in relationship to the substrate (10) is shown in FIG. 2 (behind the leading edge of the substrate). As the advance continues through the closed nip the photosensitive layer(s) are laminated to the board surface(s) until a second specified distance along the board is reached hereinafter identified as position "Y", (shown in relationship to the substrate (10) only in FIG. 2), at which time the pressure rolls (14) are separated and returned to the open nip configuration.

A time interval of not less than 0.5 seconds and generally not less than 1.0 seconds will be present between the time laminating pressure is released from the photosensitive layer(s) and the board surface(s) and a step of removal of the carrier web, i.e., the support. An example of a suitable time interval is in a range from 0.5 to 30 seconds.

As the leading edge of the laminated board emerges from between the wedge shaped plates (20) the web with the photosensitive layer is pulled back uniformly from the board (10) at an obtuse angle (such as 150°) until position "X" is reached where the photosensitive layer is trimmed in a straight line along the initial line of pressure. Trimming means that the photosensitive layer is separated, i.e., cut, into two sections across the width of the layer. After trimming at position "X", only the carrier web (17) is removed from the advancing laminated board until position "Y" (at or spaced from the edge of the substrate) is reached where the photosensitive layer is trimmed in a straight line along the trailing line of pressure by pulling the laminated board from between the plate wedges, e.g., by a gripping mechanism (22) such as described in U.S. Pat. No. 4,338,152.

Alternatively, the photosensitive layer may be trimmed at position "Y" simply by continuing the advance of the web beyond the wedge edges (21). With either mode of trimming, the board (10) has laminated thereto the photosensitive layer which is bounded by a straight leading edge at position "X" and a straight trailing edge as position "Y". Concurrently the trailing photosensitive layer remaining on the carrier web is trimmed to provide a straight edge across the web hereinafter identified as position "Z" on the remaining web of photosensitive film (16).

Typically, trimming is carried out in a range from about 0.5 and 30 seconds after lamination, with the delay being determined by the physical separation of the laminating rolls and wedge edges and the transport speed of the substrate, as well as by the temperature of lamination and the nature of the laminated photosensitive web.

After the laminated, trimmed board (10) with photosensitive layer (16) is removed from the plate wedges (20), the advance of the photosensitive web (18) is reversed to return position "Z" through the wedges (20) and open pressure rolls (14) to a convenient location in front of the open nip where the reverse motion is stopped to await the advance of the next board (10) to be laminated.

The advance of the next board (10) is synchronized with the advance of the trimmed photosensitive web (16) so that position "X" on the next board (10) coincides with position "Z" on the web (18) at the closed nip of pressure rolls (14). Subsequent steps in the lamination of the next board are the same as with the initial board.

The laminating and trimming process as described can be continued with any number of substrate boards (10) with no waste of the photosensitive layer between boards. In addition the process may be used to laminate the photosensitive layer to either the entire surface of the substrate or to just a small portion of its area.

In a further variation of this process two separate areas of the same board may be laminated and trimmed with a photosensitive layer. This variation may be accomplished in several ways. One way is to open and then close the nip of the pressure rolls (14) during the lamination step. In this instance all procedures described above are followed except that after the pressure rolls (14) are separated at position "Y" on the board (10), they are brought together again at a specified distance as the board (10) advances through the nip to a position "$X_N$" (shown in FIG. 3) to leave an intervening area of non laminating contact between the photosensitive layer and the substrate surface, i.e., from position "Y" to position "$X_N$". Similar to the process described above, lamination continues for a specified distance along the board until the position "$Y_N$" (shown in FIG. 3) is reached at which time the pressure rolls are again separated. This open/close procedure may be incorporated one or more times during the lamination of a single board and during the trimming steps at the wedge edges (21) the photosensitive layer in the intervening non laminated area(s) will remain adhered to the web (17).

Figure 3:
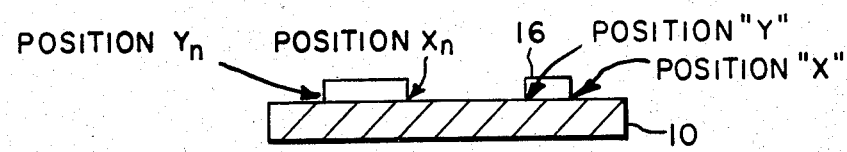
FIG. 3 is another cross section of a substrate with an applied photosensitive layer.

Another way to laminate separate areas to the same board is to pass the once laminated board back through the lamination process, in effect treating the laminated board as a new substrate with new positions being "$X_N$" and "$Y_N$" (FIG. 3). Still another way is to reverse the advance of the laminated and trimmed board (10) with photosensitive layer (16) along with the photosensitive web back through the wedges (20) and the open pressure rolls (14) to a convenient position in front of the open nip and then readvance the board and the photosensitive web so that position "Z" on the web coincides with position "$X_N$" on the circuit board (10) at the closed nip (14).

The process of this invention as described above may be further described with regard to the adhesive strengths of the layer at the interfaces to the board and carrier web. Since the carrier web must be strippable from the laminated photosensitive layer, the adhesion ($A_2$) of the photolayer to the substrate board must also exceed its adhesion ($A_1$) to the carrier web. It is also essential that there be little or no adhesion ($A_3$) of the photosensitive layer to the board in areas of non lamination contact (e.g., in board areas between the board edges and positions "X" or "Y" or in intervening areas between positions "Y" and "$X_N$") even though intimate contact is made (i.e., no substantial pressure contact is made). The proper balance of these adhesive forces in photosensitive systems can be provided by adjustment of the relative proportions of components in the photosensitive layer. The proper balance of forces may likewise be provided by adjusting the lamination and/or trimming conditions and by suitable pretreatment of the photosensitive layer and/or substrate board surface.

The advantages of using pretreatment to improve lamination adhesion ($A_2$) has already been described in European patent application No. 81103966.8 and is incorporated herein by reference. In particular, the board surfaces are cleaned reproducibly immediately before lamination and a liquid is applied to the nip between the board and the photosensitive layer. The liquid, hereinafter described, is applied either to the substrate or to the photosensitive layer using whatever means is convenient. In the preferred mode of this invention the liquid is sprayed (24) onto the photosensitive surface before lamination contact. Lamination adhesion ($A_2$) may also be improved by lamination at elevated temperatures. Elevated temperatures typically are achieved by using heated rolls (14) at lamination. Generally, the substrate board (10) is passed through a preheater (12) to achieve an elevated temperature which is supplemented by use of heated lamination rolls.

Since elevated temperatures increase the adhesion of the photosensitive layer to the board ($A_2$) as well as the carrier web ($A_1$), it is desirable to control the temperatures of the board-photoresist interface and the photoresist-carrier web interface independently, thus providing a degree of control over the relationship between $A_2$ and $A_1$. In a preferred mode of this invention, the carrier web is cooled to a temperature at which $A_1$ becomes substantially less than $A_2$ after lamination using the wedged shape plates (20) as cooled heat sinks.

The liquids useful in this invention may be solvents or nonsolvents for the thermoplastic layer being laminated such as the liquids described in European patent application No. 81103966.8. Suitable liquids include water, fluorocarbons, aqueous and fluorocarbon solutions of alcohols, e.g., methanol, ethanol and propanol; alkoxyalkanols, e.g., 2-ethoxy ethanol and 2-butoxy ethanol, and alkylene carbonates, e.g., ethylene carbonate and propylene carbonate. Also useful are aqueous solutions containing surfactants, e.g., a non-ionic detergent such as an ethylene oxide condensate and/or aqueous soluble polymers, e.g., maleic anhydride/butadiene copolymer; and aqueous solutions of heterocyclic compounds such as those described in U.S. Pat. No. 3,645,772, or other chelating agents. The particular liquid of choice will depend on the character of the photosensitive layer and/or the laminating conditions.

The invention may be used advantageously in the lamination of a broad spectrum of thermoplastic layers. Although the invention is particularly useful for the lamination of photosensitive resist elements to substrates which are to be used for making printed circuit boards, lamination of photosensitive layers to substrates in the preparation of lithographic printing plates is also suitable.

In practicing the invention, photosensitive film resists of various types may be used. In general photohardenable, negative-working resists are photopolymerizable films of the type disclosed in U.S. Pat. No. 3,469,982 and the photocrosslinkable elements of the type disclosed in U.S. Pat. No. 3,526,504. Positive-working, resist elements may be of the photosolubilizable type, e.g., such as the o-quinone diazide elements of U.S. Pat. No. 3,837,860, or of the photodesensitizable type, e.g., such as the bisdiazonium salts of U.S. Pat. No. 3,778,270 or the nitroaromatic composition of U.S. Pat. No. 4,198,242.

The photosensitive layer used in the process is preferably aqueous alkali processible in the sense that it is soluble and thereby developable in aqueous alkali solution, e.g., 1 wt. % $Na_2CO_3$ at 29.4° C. for 90 seconds at a spray pressure of 1.38 $kg/cm_2$.

An element containing an image-yielding, non-blocking photopolymerizable stratum on a strippable support is preferably used such as the one described in U.S. Pat. No. 4,293,635. Also useful are the aqueous alkali processable photopolymerizable strata disclosed in U.S. Pat. No. 4,273,857. Alternatively, particularly if the photopolymerizable layer is tacky, the remaining surface of the supported, photopolymerizable stratum may be protected by a removable cover sheet or when the element is stored in roll form, the stratum surface may be protected by the contiguous reverse surface of the support. The photosensitive composition is present in a dry coating thickness of about 0.0003 inch (0.0008 cm) to about 0.01 inch (0.025 cm) or more. A suitable strippable support which preferably has a high degree of dimensional stability to temperature changes, may be chosen from a wide variety of films composed of high polymers, e.g., polyamides, polyolefins, polyesters, vinyl polymers, and cellulose esters, and may have a thickness of from 0.00025 inch (0.0006 cm) to 0.008 inch (0.02 cm) or more. A particularly suitable support is a transparent polyethylene terephthalate film having a thickness of about 0.001 inch (0.0025 cm).

The photohardenable layer is prepared from polymeric components (binders), monomeric components, initiators and inhibitors.

Suitable binders which can be used as the sole binder or in combination with others include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

Preferably, the binder should contain sufficient acidic or other groups to render the composition processible in aqueous developer as described hereinabove. Useful aqueous-processible binders include those disclosed in U.S. Pat. No. 3,458,311 and in U.S. Pat. No. 4,273,857. Useful amphoteric polymers include interpolymers derived from N-alkylacrylamides or methacrylamides, acidic film-forming comonomer and an alkyl or hydroxyalkyl acrylate such as those disclosed in U.S. Pat. No. 3,927,199 and U.S. Pat. No. 4,293,635.

It is preferred that the photosensitive layer be relatively harder than those which generally have been available before now. Greater hardness of the layer provides greater dimensional stability and thus there is less requirement for support by the support film.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3- methacryloxy-2-dydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benezene, and 1,3,5-triisopropenyl benzene.

In addition to the ethylenically unsaturated monomers mentioned above, the photohardenable layer can also contain at least one of the following free radical-initiated, chain-propagating, addition-polymerizable, ethylenically unsaturated compounds having a molecular weight of at least 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such heteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos. 3,427,161; 3,479,185; and 3,549,367 can be used as initiators. Also useful are initiating systems containing substituted cyclohexadienone compounds disclosed in U.S. Pat. No. 4,341,860. Also useful with photoiniators and photoinhibitors are sensitizers disclosed in U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Various dyes and pigments may be added to increase the visibility of the resist image. Any colorant used, however, should preferably be transparent to the actinic radiation used.

It is essential that the printed circuit substrates used in the process of the invention be clean and free of any extraneous materials to insure that these materials do not interfere with wetting and bonding of the surface. For this reason, it will frequently be desired to clean printed circuit substrates prior to lamination by one or more of the several cleaning processes which are well-known in the field of printed circuit board manufacture. The particular type of cleaning depends upon the type of contamination—organic, particulate or metallic. Such methods include degreasing with solvents and solvent emulsions, mechanical scrubbing, alkaline soaks, acidification and the like, followed by rinsing and drying. A suitable technique which is directly followed by lamination is described in European patent application No. 81103966.8.

EXAMPLE 1

A series of two sided copper clad substrate boards are laminated with photoresist film at a rate of about 3 boards per minute using an apparatus depicted as a top view in FIG. 1 so that the boards are advanced through the apparatus on edge in a vertical or upright position.

The series of copper clad boards are 0.062 inch thick "G-10" copper clad fiberglass epoxy boards which are 18 inches high and 24 inches long and contain the same pattern of copper plated through-holes. The boards are advanced through the apparatus on their 24 inch edges.

Two rolls of photosensitive film consisting of a 0.001 inch thick polyethylene terephthalate support or carrier web and a 0.002 inch thick 17.5 inch wide photosensitive layer are aligned along the path of the advancing substrates so that the laminated layer will be about 0.25 inch from the top and bottom substrate edges. The photosensitive layer has the following composition:

| Component | Parts by Weight |
| --- | --- |
| 1:1 Copolymer of Styrene and maleic anhydride partially esterified with isobutyl alcohol; mol. wt. ca. 20,000 acid number ca. 180 | 37.2 |
| Terpolymer of 17% ethyl acrylate 71% methyl methacrylate, and 12% acrylic acid; mol. wt. ca. 300,000; acid number ca. 105 | 11.7 |
| Interpolymer formed from 40% N—tert.-octytl acrylamide 34% methyl methacrylate, 16% acrylic acid, 6% hydroxy propyl methacrylate, and 4% t-butyl amino ethyl methacrylate; mol. wt. ca. 500,000 | 4.7 |
| Polyoxethylated trimethylolpropane | 9.3 |

| Component | Parts by Weight |
| --- | --- |
| triacrylate (20 moles of ethylene oxide) (M.W. 1162) | |
| Trimethylolpropane triacrylate | 11.6 |
| Benzophenone | 5.1 |
| 4,4'-Bis(dimethylamino) benzophenone (Michler's ketone) | 0.65 |
| (2,2'Bis(,2-chlorophenyl) 4,4',5,5'-tetraphenyl biimidazole | 2.8 |
| Leuco crystal violet | 0.2 |
| Benzotriazole | 0.2 |
| 1,4,4-Trimethyl-2,3-diazobicyclo-[3.2.2]-non-2-ene-2,3-dioxide | 0.06 |
| Victoria Green (C.I. Pigment Green 18) | 0.03 |
| Polyethylene beads, ave. particle size 2 microns (Eftofine FT-800F) | 16.5 |

Each board of the series is first passed through a cleaning module which is in line with the apparatus depicted in FIG. 1. In the cleaning module the board passes between two 4 inch diameter cylindrical brushes rotating at about 1700 RPM in the direction of the board transport. The brushes have nylon bristles impregnated with silicon carbide to scrub the boards' copper surfaces and room temperature water is sprayed into the nips formed by each brush on the board surface. As the board emerges from the rotating brushes, each side is rinsed with a water spray and excess water is removed by an air knife.

As each board emerges from the cleaning module, it passes immediately into a heating module consisting of two parallel banks of three rubber covered rolls heated to about 250° F. As each board passes between the rolls, each copper surface is conductively heated to about 150° F.

The leading edge of each board as it passes from the heating module into the open nip of the laminating rolls, triggers a photosensor which encodes and synchronizes subsequent laminating and trimming steps. The first step of the encoded sequence is to advance the photosensitive web at the same rate as the board advance and simultaneously spray the advancing photosensitive layers with a fine spray mist of 0.1% by weight aqueous solution of a maleic anhydride/butadiene copolymer. (The solution is prepared from sufficient water and Maldene ® 287, a product of Borg-Warner Corporation, which is a 42% by weight water solution of the free acid of maleic anhydride/butadiene copolymer and has a specific gravity of 1.09–1.07, a pH of 2.0, a brookfield viscosity of 2500 cps and an acid number of 700 [Free Acid].) As the leading edge of the board and advancing photosensitive web passes between the open nip of laminating rolls (heated to 150° F.), the second step of the encoded sequence closes the nip of the laminating rolls to initiate lamination of the photosensitive layers to each side of the board about 0.25 inches back from the board's leading edge. As lamination proceeds, the film-board laminate passes between two wedge shaped plates which can be water cooled to lower the temperature of the laminate structure therebetween. As the laminate structure emerges from the wedges, each polyethylene terephthalate web is drawn back over each respective acute angled edge to form an obtuse angle with the emerging board of about 150°. The surface temperature of the web at the line along which it is drawn back is approximately 90° F. while the copper substrate surface remains at approximately 150° F. The photosensitive layers are retained on each web until the position is reached where lamination was initiated, i.e., about 0.25 inch from the board leading edge, at which position both photosensitive layers break in a straight line across the webs and subsequent portions of the photosensitive layers are transferred and firmly adhered to the copper surfaces of the board.

As lamination proceeds, the trailing edge of the board passing out of the preheat triggers the photosensor a second time to encode the final steps of the lamination and trimming procedure. As the board proceeds into the closed nip, the nip is opened at a position about 0.25 inches prior to the board's trailing edge. As the film-board laminate emerges from the wedge shaped plates, the board is gripped at its upper and lower edges and is pulled from between the wedges so as to break each photosensitive layer in a line across the board at the position where the lamination rolls were opened, i.e., about 0.25 inches from the trailing edge. The final step of the encoded procedure is to rewind each photosensitive web so as to return the trimmed edges of the photosensitive layer thereon back through the open nip to a pre-set position to await the advance of the next substrate.

For each subsequent substrate board being laminated, the above procedure steps are the same except that the advance of the trimmed edges of the photosensitive layers is synchronized so that each trimmed edge of the photosensitive layer is applied to the board surface at about 0.25 inches back from the board's leading edges. In this instance, lamination rolls can be closed just prior to contact of the photosensitive layer edges to the board surfaces.

EXAMPLE 2

A series of two sided copper clad substrate boards are laminated as described in Example 1 with a photoresist film having the following composition:

| Component | Parts by Weight |
| --- | --- |
| Terpolymer of 17% ethyl acrylate, 71% methyl methacrylate, and 12% acrylic acid; mol. wt. ca. 300,000; acid number ca. 105 | 2 |
| Interpolymer formed from 40% N—tert.-octyl acrylamide, 34% methyl methacrylate, 16% acrylic acid, 6% hydroxy propyl methacrylate, and 4% t-butyl amino ethyl methacrylate; mol. wt. ca. 500,000 | 63.85 |
| Triethylene glycol dimethacrylate | 10 |
| Trimethylolpropane triacrylate | 10 |
| Benzophenone | 8 |
| 4,4'-Bis(dimethylamino) benzophenone (Michler's ketone) | 0.1 |
| (2,2'-Bis(2-chlorophenyl)-4,4',5,5'-tetraphenyl biimidazole | 1.5 |
| Leuco crystal violet | 0.3 |
| Benzotriazole | 0.2 |
| Victoria Green (C.I. Pigment Green 18) | 0.05 |
| Sodium dioctyl sulfosuccinate | 4 |

The procedures used for laminating and trimming this film to a substrate are substantially the same as described in Example 1 except for the following.

The thickness of the photosensitive layer is 0.001 inch.

The rolls of the heating module are heated to about 250° F. so as to raise the board surfaces to about 150° F. Likewise, the laminating rolls are heated to 150° F.

The fine spray of liquid applied to the photosensitive surface consists of a 10% by weight aqueous solution of propylene carbonate.

EXAMPLE 3

In the preparation of smaller dimensional circuit boards, a set of boards are frequently prepared from a single large substrate which is processed and then cut into the individual boards. In such instances, areas of the large substrate between component board areas are extraneous and need not have resist laminated thereto.

Using a modification of the procedures described in Example 1, lamination of film to extraneous intermediate areas can be avoided. Procedures are the same as described in example 1 up through the second step of the encoded sequence at which point the laminating rolls are first brought together to close the nip. As lamination proceeds, the boundary of the first circuit board component is reached. At that point, the lamination rolls are separated so that, at most, the substrate surfaces and photosensitive layer surfaces are in non-laminating contact. As the laminate advances, the leading boundary of the second circuit board component is reached. At that point, the lamination rolls are again brought together to close the nip and lamination procedures proceed as described in Example 1.

As the trailing edge boundary of the first circuit board component area emerges from between the wedges, the photosensitive layer breaks in a straight line along the boundary and subsequent photosensitive layer is removed with the polyethylene terephthalate web from non-laminating contact with the copper surface. As the boundary of the second circuit board component area emerges from between the wedges, the photosensitive layer again breaks in a straight line across the boundary and subsequent photosensitive layer is again firmly laminated to each copper surface with no transfer to the polyethylene terephthalate web. Subsequent process steps are the same as described in Example 1.

We claim:

1. A process for laminating discrete sections of a supported photosensitive layer to at least one sheet substrate comprising
    (a) laminating under pressure a section of the supported photosensitive layer to a moving sheet substrate,
    (b) releasing the laminating pressure from the photosensitive layer and the sheet substrate,
    (c) removing the support from the laminated layer and trimming the photosensitive layer substantially at a line dividing where laminating pressure and no laminating pressure has been applied to said photosensitive layer, wherein a time interval of not less than 0.5 seconds is present between the release of pressure in step (b) and the support removal of step (c),
    (d) reversing the direction of travel of the photosensitive layer which is not laminated to the sheet substrate,
    (e) repeating steps (a), (b), and (c) to laminate another section of photosensitive layer.

2. The process of claim 1 wherein the substrate to be laminated and the leading edge of the photosensitive layer are synchronized to allow contact and lamination of the supported photosensitive layer at a predetermined position on the substrate.

3. The process of claim 1 wherein line pressure is applied for lamination in step (a).

4. The process of claim 1 wherein the line pressure is from a nip of two rolls.

5. The process of claim 1 wherein the reversal of the photosensitive layer is to a position in the direction of substrate travel at or before the line at which line pressure is applied in step (a).

6. The process of claim 5 wherein said reversal is to a position in the direction of substrate travel before the line at which line pressure is applied in step (a).

7. The process of claim 1 wherein support material for said supported photosensitive layer is removed from the photosensitive layer concurrently with the trimming of step (c).

8. The process of claim 1 wherein cooling is employed to lower the temperature of the laminated photosensitive layer to aid in the trimming of step (c).

9. The process of claim 7 wherein cooling is employed to lower the temperature of the laminated photosensitive layer to aid in the trimming of step (c).

10. The process of claim 1 wherein a series of sheet substrates are laminated.

11. The process of claim 1 wherein the trimmed laminated photosensitive layer does not abut at least one substrate edge which is at least substantially perpendicular to the direction of substrate travel during lamination.

12. The process of claim 11 wherein the trimmed laminated photosensitive layer does not abut two substrate edges which are at least substantially perpendicular to the direction of substrate travel during lamination.

13. The process of claim 1 wherein the substrate is in a horizontal position during lamination.

14. The process of claim 1 wherein the substrate is in a vertical position during lamination.

15. The process of claim 1 wherein both opposite sides of the substrate are laminated with supported photosensitive layers.

16. The process of claim 14 wherein lamination of opposite sides of the substrate is undertaken simultaneously.

17. The process of claim 1 wherein said lamination of step (a) includes heating.

18. The process of claim 17 wherein the substrate is heated prior to lamination.

19. The process of claim 1 wherein a liquid is present at the interface of the lamination of step (a).

20. The process of claim 19 wherein liquid is applied to the photosensitive layer prior to lamination.

21. The process of claim 1 wherein step (e) is for a different substrate.

22. The process of claim 1 wherein the time interval specified under step (c) is not less than 1.0 second.

23. The process of claim 1 wherein the support is removed at an obtuse angle measured from the place of the laminated photosensitive layer.

24. A process for laminating a series of discrete sections of a supported photosensitive layer to a series of sheet substrates comprising
    (a) laminating under line pressure a section of the supported photosensitive layer to a moving sheet substrate,
    (b) releasing the laminating pressure from the photosensitive layer and the sheet substrate, (c) removing the support from the laminated layer and trimming the photosensitive layer substantially at a line dividing where laminating pressure and no laminating pressure has been applied to said photosensitive layer, wherein the trimmed laminated photosensitive layer does not abut at least one substrate edge which is at least substantially perpendicular to the direction of substrate travel during lamination, wherein a time interval of not less than 0.5 seconds is present between the release of pressure in step (b) and the support removal of step (c), (d) reversing the direction of travel of the portion of the photosensitive layer which is not laminated to the sheet substrate to a position before the line at which line pressure is applied in step (a), (e) repeating steps (a), (b), and (c) to laminate a discrete portion of photosensitive layer to a different substrate wherein the different substrate to be laminated and the leading edge of the photosensitive layer are synchronized to allow contact and lamination of the supported photosensitive layer at a predetermined position on the different substrate.

25. The process of claim 24 wherein the time interval specified under step (c) is not less than 1.0 seconds.

26. The process of claim 24 wherein the support is removed at an obtuse angle measured from the place of the laminated photosensitive layer.

27. The process of claim 24 wherein line pressure is from a nip of two rolls.

28. The process of claim 24 wherein support material for said supported photosensitive layer is removed from the photosensitive layer concurrently with the trimming of step (c).

29. The process of claim 28 wherein cooling is employed to lower the temperature of the laminated photosensitive layer to aid in the trimming of step (c).

30. The process of claim 27 wherein the substrate is in a vertical position during lamination.

31. The process of claim 30 wherein both opposite sides of the substrates are laminated simultaneously with supported photosensitive layers.

32. The process of claim 1 wherein step (e) is with the same substrate.

* * * * *